United States Patent [19]

Fjare et al.

[11] Patent Number: 5,089,593
[45] Date of Patent: Feb. 18, 1992

[54] POLYIMIDE CONTAINING 4,4'-BIS(4-AMINO-2-TRIFLUOROMETHYL-PHENOXY)-BIPHENYL MOIETIES

[75] Inventors: Douglas E. Fjare, Naperville; Neal R. Nowicki, St. Charles, both of Ill.

[73] Assignee: Amoco Corporation, Chicago, Ill.

[21] Appl. No.: 463,147

[22] Filed: Dec. 22, 1989

Related U.S. Application Data

[63] Continuation-in-part of Ser. No. 212,511, Jun. 28, 1988, abandoned.

[51] Int. Cl.$^5$ .................. C08G 63/00; C08G 69/26; C08G 8/02; C08G 14/04
[52] U.S. Cl. .................. 528/188; 528/125; 528/128; 528/170; 528/172; 528/174; 528/176; 528/183; 528/190; 528/220; 528/229; 528/350; 528/353; 528/185; 428/473.5
[58] Field of Search .......... 528/353, 125, 128, 185, 528/170, 172, 188, 183, 190, 176, 350, 174, 220, 229; 428/473.5

[56] References Cited

U.S. PATENT DOCUMENTS

| | | | |
|---|---|---|---|
| 4,336,175 | 6/1982 | Gibbs | 528/353 |
| 4,528,004 | 7/1985 | Makino et al. | 428/473.5 |
| 4,720,539 | 1/1988 | Rabilloud et al. | 528/353 |
| 4,760,126 | 7/1988 | Numata et al. | 528/352 |

FOREIGN PATENT DOCUMENTS 3490169 5/1985 Fed. Rep. of Germany.

OTHER PUBLICATIONS

Translation of German 3490169 dated 5-15-85.

Primary Examiner—Harold D. Anderson
Assistant Examiner—P. Hampton-Hightower
Attorney, Agent, or Firm—Rae K. Stuhlmacher; William H. Magidson; Ralph C. Medhurst

[57] ABSTRACT

Polyimides useful in multilayer electronic devices containing the 4,4'-bis(4-amino-2-trifluoromethylphenoxy) biphenyl moiety have low dielectric constants, low moisture uptake, high thermal degradation stability, low glass transition temperature.

9 Claims, No Drawings

POLYIMIDE CONTAINING 4,4'-BIS(4-AMINO-2-TRIFLUOROMETHYL-PHENOXY)-BIPHENYL MOIETIES

This application is a continuation-in-part of copending U.S. patent application Ser. No. 212,511, filed June 28, 1988, now abandoned incorporated herein by reference.

BACKGROUND OF THE INVENTION

This invention relates to polyimides and, more particularly, to polyimides containing 4,4'-bis(4-amino-2-trifluoromethylphenoxy)biphenyl moieties.

Aromatic polyimides and polyamide-imides have found extensive use in industry as fibers, composites, molded parts and dielectrics due to their toughness, flexibility, mechanical strength and high thermal stability. In particular, polyimides are useful in the electronic industry due to their lower dielectric constant and high electrical resistivity. Such polymers have been used in both film and coating form as advanced materials for such uses as passivation and insulating coatings, interlevel dielectrics, die attach adhesives, flexible circuit substrates, and the like.

Polyamic acids, particularly in solution form, are extensively used to form coatings, such as passivation and insulating coatings. The polymers are generally made by dissolving the diamine in a compatible solvent and then adding the dianhydride to make a solution of polyamic acid. The resulting solution of polyamic acid is spread on a substrate, and the solvent evaporated to imidize fully the polyamic acid and make the coating. The polyamic acid, then, must be soluble in the solvent.

High molecular weight polymers generally provide increased thermal degradation stability and improved mechanical properties, such as tensile strength and elongation. For example, polyimides made from 4,4'-bis(4-aminophenoxy)biphenyl have the toughness, flexibility and thermal degradation stability necessary to meet the rigorous processing and operating conditions required for certain uses. However, they do not exhibit the combination of high thermal degradation temperature, low dielectric constant, low moisture uptake, and low glass transition temperature (Tg) required for certain electronic applications.

Polyimides, in general, are used as coatings over a topographical (i.e., nonplanar) surface on a substrate. As the polymer solution begins to dry (or cure), the polymer flows to maintain a planar surface. However, the flow ceases as the solvent evaporates and as the solution becomes more viscous, but before the film is completely dry. Once the polymer ceases to flow, the film shrinks and conforms to the nonplanar substrate rather than forming a planar surface. In other words, planarization is limited by the shrinkage that occurs after the film can no longer flow quickly enough to keep up with the drying (and imidization) process.

The formation of a planar polymer coating surface is particularly important in electronic applications where two or more layers of coated substrate can be stacked, one on top of the other, and the substrate layers separated by the planarized polyimide. Ideally, planarization would yield a planar surface, regardless of the complexity of the underlying topography.

A high glass transition temperature generally is a desirable polymer property; however, in the electronic industry a very high glass transition temperature is believed to have an adverse effect on planarization. Thus, it is desirable to have a polyimide which approaches a glass transition temperature range that will satisfy the minimum thermal requirements necessary for electronic applications, but which will allow the polyimide to flow longer (or until a higher percent of solvent is removed) and shrink less to form a more planar surface.

DE 3,490,169 discloses polymers made from a 4,4'-bis(4-amino-3-trifluoromethylphenoxy)biphenyl isomer. In other words, the German reference is directed to a particular isomer wherein a trifluoromethyl (CF$_3$) group is in a position that is ortho to the amine group. The reported Tg's of polyimides of this reference which are made from 4,4'-bis(4-amino-3-trifluoromethylphenoxy)biphenyl are very high, in excess of 400° C. (see Example 1), which would make this isomer unsuitable for planarization in a multilayer application. Further, a bulky group which is ortho to the amine groups can lower the reactivity of the diamine making the diamine difficult to polymerize. This reference also discloses a generic phenoxybiphenyl formula containing CF$_3$ groups attached to one or more aromatic rings; however, there is no specific disclosure of the isomer of the present invention or of any polyimide made therefrom.

SUMMARY OF THE INVENTION

In one aspect the novel polyimides of the present invention comprise recurring units of

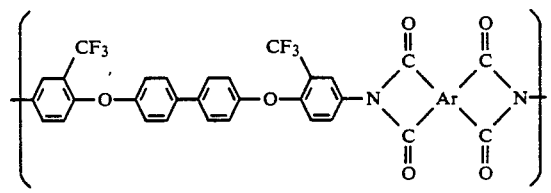

wherein Ar is at least one aromatic nucleus, such as

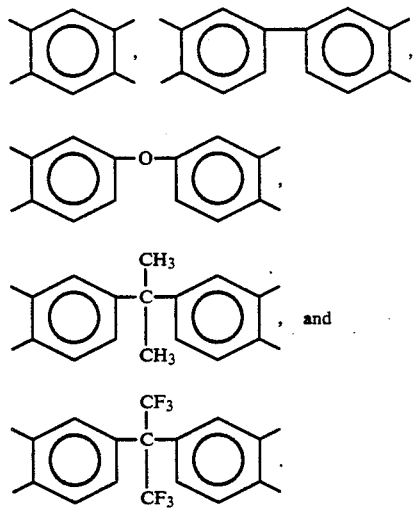

In another aspect, the present invention includes polyamic acids and their derivatives, such as esters, and acid chlorides, and the solutions thereof

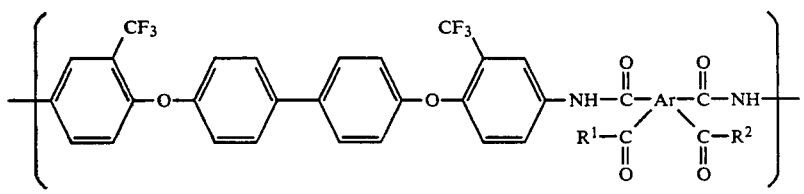

wherein Ar is as defined above; $R^1$ and $R^2$ are independently selected from halogen, —OH, and —$OR^3$; where $R^3$ is an alkyl group of 1 to 4 carbon atoms.

BRIEF DESCRIPTION OF THE INVENTION

Briefly, we have found that the novel polyimides of the present invention can be formed as the polycondensation product of 4,4'-bis(4-amino-2-trifluoromethylphenoxy)biphenyl and aromatic dianhydrides or derivatives thereof.

The polyimides of the present invention have $CF_3$ groups which are meta to the nitrogens from the diamine moiety. Further, the polymers of the present invention have good thermal degradation temperatures, exhibit low dielectric constant, low moisture uptake, low glass transition temperature, and planarize well.

The polymers of this invention are useful in electronic applications, such as multilayer electronic devices, and can be made in the form of flexible substrates for electrical components, interlevel dielectrics, passivation, etc.

In particular, the glass transition temperature of the polyimides of this invention typically is between about 225° C. and about 400° C., preferably between about 225° C. and about 325° C., and most preferably between about 250° C. to about 275° C. to provide advantageous planarization properties. The temperature of onset of degradation in nitrogen is typically between about 425° C. and about 525° C. Preferably, the onset of degradation is above 450° C. to provide polyimides that process well and are suitable for multilevel dielectric applications. The polyimides of the present invention have a low intake of moisture at 100% relative humidity (R.H.), typically between about zero and about 0.3 weight percent, and most preferably less than about 0.2 weight percent.

In greater detail, the polymers of this invention are formed by reaction of the 4,4'-bis(4-amino-2-trifluoromethylphenoxy)biphenyl with one or more aromatic dianhydrides or their corresponding derivatives. The aromatic dianhydrides useful in this invention include the symmetrical dianhydrides of benzene, naphthalene, biphenyl (BPDA), diphenylether, benzophenone (BTDA), pyromellitic dianhydride (PMDA), bis-(3,4-dicarboxyphenyl)ether dianhydride (OPAN), bis(3,4-carboxyphenyl)sulfone dianhydride (SPAN), 2,2-bis(3,4-dicarboxyphenyl)propane dianhydride (IPAN), or 2,2-bis(3,4-dicarboxyphenyl)hexafluoropropane dianhydride (6FDA). Preferred polyimides of this invention are made from the symmetrical dianhydride of biphenyl tetracarboxylic acid or diphenylether tetracarboxylic acid, IPAN, PMDA, OPAN, or 6FDA. More preferably, the polyimide is made from 6FDA, IPAN, OPAN, PMDA, or BPDA, and most preferably from 6FDA, IPAN, and BPDA because the resulting polymers have an advantageous combination of low dielectric constant, low moisture uptake, and low Tg.

The polyimides of the present invention may be used alone or in conjunction with aliphatic diamines or other aromatic diamines. Suitable aliphatic amines contain 2 to about 12 carbon atoms, e.g., ethylenediamine, trimethylenediamine, hexamethylenediamine, dodecamethylenediamine, and the like. In those cases where an aliphatic diamine containing 3 to 12 carbon atoms comprises more than 10 to 20 weight percent of the diprimary amine, the reaction product can have a higher solubility than product produced using just aromatic amines.

Suitable aromatic diamines which may be used in conjunction with 4,4'-bis(4-amino-2-trifluoromethylphenoxy)biphenyl to form the polyimides of the present invention include metaphenylenediamine, oxybisaniline, methylenebisaniline, diaminodiphenylpropane, diaminodiphenylsulfide, diaminobenzophenone, toluenediamine, metaxylene diamine, 4,4'-bis(4-aminophenoxy)biphenyl, 4,4'-bis(4-aminophenoxy)diphenylpropane, etc. Generally, the 4,4'-bis(4-amino-2-trifluoromethylphenoxy)biphenyl can range from about 5 mol percent to 100 mol percent, preferably at least 20 mol percent, of the total diamines. Typically, for best results it is preferable to use only aromatic diamines since the thermal degradation properties of the polymers decrease when aliphatic diamines are employed.

The polymers of the present invention generally are prepared in accordance with known polycondensation methods. The diamine and dianhydrides are present in approximately equivalent amounts. However, by using an excess of diamine or dianhydride in the reaction mixture (ranging from about 1.2:1 to about 1:1.2), the chain length of the product can be adjusted. Further, the chain length can be restricted by adding a predetermined quantity of a monoamine or a monoanhydride to the reaction mixture.

Alternatively, the polyimides of the present invention can be prepared from the salts of the diacids and diamines by conventional melt condensation procedures. In this case, an aqueous solution containing a mixture of the appropriate salt, or salts, and the diamine is heated under conditions of controlled time, temperature, and pressure to remove the water and effect polymerization.

In somewhat greater detail, the polymers of this invention are preferably made by dissolving the aromatic diamine, preferably polymer grade diamine, in a solvent and adding the dianhydride at a temperature between about 0° C. and 100° C., preferably in a range from about 10° C. to about 40° C., to make a solution of the polyamic acid polymer.

The solvent must be compatible with the diamine, dianhydride, resulting polyamic acid, cured polyimide, and initial substrate. In multilayer applications, the initial substrate generally is a material that also provides a base for the structure, such as silicon, ceramic (for example, glass, and the like). A metal pattern (for example, aluminum, gold, copper, titanium, chromium, tungsten, and the like) is positioned over the initial substrate and the polyamic acid solution is spread on the metal pattern-covered substrate. Thereafter, the solvent is evaporated to fully imidize the polyamic acid and make the layer or coating.

Subsequent layers can comprise the metal pattern positioned on an underlying polyimide layer which was previously applied, and cured. Therefore, the solvent must be compatible with the cured polyimide so as not to cause degrading, swelling, or cracking of the underlying polyimide. Solvents which are suitable include aprotic polar solvents, such as N-methylpyrrolidone (NMP), N,N-dimethylacetamide, dimethylsulfoxide, and the like.

The coating or underlying polyimide is desirably thin, preferably between about 1 and about 30 microns in thickness. In general, dilution of the polyamic acid solution is based on the thickness requirement of the final coating, the viscosity and solids content of the solution, and the spin curve data for the polymer. Typically, solutions of the polyamic acid polymer range from about 5 to about 50 weight percent, preferably, from about 10 to about 40 weight percent. The spin curve data are obtained by spin-coating the polymer onto the substrate at various spin speeds, measuring the resulting thickness and plotting thickness versus spin speed. Clean, dry, high-purity solvent may be used as the diluent. The diluted solution is generally pressure-filtered before further processing.

The polyamic acid solution is statically applied to a nonrotating substrate and spread across the surface by spinning. The substrate is then spun at the spin speed determined from the spin curve for the final coating thickness required. In this case, a second stage of reaction is required to imidize the amic acid groups. Imidization can be accomplished thermally, preferably at a temperature in a range from about 200° C. to about 400° C.

The procedure for preparation of a multilayer structure in which the polyimide of the present invention is used, for example, as an insulating coating, includes diluting the polymer solution to the proper viscosity and solids level to obtain the desired coating thickness, filtering, cleaning the substrate, applying the adhesion promoter, and spin-coating the polymer solution on the surface of the substrate. The coating process is repeated as desired, and the polyimide is thermally cured.

The percent of planarization of the polymer coating (or polymer layer) can be determined by a procedure that considers the difference in the height (or thickness) of the cured polymer coating over the metal pattern as compared to the height of the cured polymer coating over the substrate. In this procedure, a substrate, such as silicon, is covered with a thin layer of metal, such as aluminum. The metal can be deposited on the substrate by conventional deposition methods, such as electron beam evaporation, or by sputtering. Thereafter, the layer of aluminum is patterned with a positive photoresist solution and then developed with an aluminum etch solution to form a metal pattern having open areas, or vias, exposing the substrate. The percent planarization of the polyimide can be calculated using the following formula:

Percent Planarization = 100% × (1 − (h2/h1))

where h1 is the vertical dimension measuring the thickness of the aluminum pattern; and h2 is the vertical dimension measuring the thickness of the cured polyimide which is over the aluminum pattern (i.e., the step height created by the polyimide shrinking over the aluminum pattern).

The polyamic acid solution can be spin coated over the metal line structure to give a film of about 2 to about 4 microns thick. The film can be cured, for example, by heating in a nitrogen atmosphere (one hour at 200° C. and one hour at 400° C.). After curing, the step height of the coating over the metal lines is measured and the percent planarization of the polyimide is calculated.

The following examples will serve to illustrate certain embodiments of the herein disclosed invention. These examples should not, however, be construed as limiting the scope of the invention as there are many variations which may be made thereon without departing from the spirit of the disclosed invention, as those of skill in the art will recognize.

EXAMPLES

All percents used are weight percents. Test procedures used to characterize the polymers of this invention are as follows:

Dielectric Constant (E)

Measurements of dielectric constant were made on thin films (0.7 to 2 mils thick) cast from polyamic acid solutions onto glass plates and thermally cured. The measurements were made using a two-fluid cell technique as described in ASTM D150.

Moisture Absorption and Change in Dielectric Constant

Moisture absorption measurements were made on wafer-level capacitor structures. Three-layer structures of aluminum/polymer/aluminum were fabricated on silicon wafers as set forth in U.S. Ser. No. 212,511, filed on June 28, 1988, incorporated herein by reference. Aluminum thickness was 0.6 microns, polymer thickness was 1 to 2 microns, and capacitor size was 0.01 square centimeters. Capacitance of the structures was measured between 50° C. and 300° C. The moisture absorption values were calculated based on the difference between the measured 1 MHz dielectric constants at 50° C. for the first and second heats of the test according to the formula:

$$\text{Equilibrium Moisture (100\% R.H.)} = \frac{-2\Delta e}{0.4}$$

which formula is based upon 2 percent equilibrium moisture per unit change in epsilon, and where $\Delta e$ is the change in dielectric constant between the first and second heats. The start of the first heat is assumed to be at 40% R.H. as the wafers were allowed to equilibrate for two days at 40% R.H. prior to testing. The start of the second heat is assumed to be approximately 0% R.H. as the wafers were reheated immediately after the water was driven off during the first heat. The change in dielectric constant at 40% R.H. is the percent difference between the measured 1 MHz dielectric constants at 50° C. for the first and second heats of the test.

Glass Transition Temperature (Tg)

The glass transition temperature (Tg) of the polyimide was measured by differential scanning calorimetry. A temperature ramp rate of 20° C./minute was used for all determinations.

Temperature of Onset of Degradation (TGA)

The temperature of onset of degradation (TGA) of the polymers was measured by thermogravimetric analysis in air and nitrogen. The onset temperature is the temperature at which 1 weight percent weight loss is found at a heating rate of 10° C./minute. Measurements were made on thin films cast from polymer solutions onto glass plates and thermally cured.

Inherent Viscosity (IV)

Inherent Viscosity (IV) was determined at 0.5 weight percent in NMP at 25° C.

Preparation of FAPB

In a 100 ml resin kettle was placed 1.749 g 4,4'-diphenol, 4.247 g 2-chloro-5-nitrobenzotrifluoride, 3.373 g potassium carbonate, and 50 g N,N-dimethylformamide. The mixture was heated and stirred under a nitrogen atmosphere at 140° C. for 3 hrs. The mixture was then poured into an excess of water to precipitate the dinitro precursor to FAPB. The precipitate was filtered, washed with additional water and air-dried.

To 600 ml of ethanol were added 54.7 g of dinitro intermediate and 10 g of 1% Pd/C. This mixture was placed under 400 psig hydrogen pressure and heated to about 95° C. with good stirring. After 45 min. the pressure was released and the reaction was cooled. The catalyst was filtered from the reaction mixture, and the ethanol was removed to leave 84.4 g of crude product. The crude product was purified by dissolving it into hot toluene with activated carbon, filtering, and crystallizing to give 16.3 g of the purified meta isomer 4,4'-bis(4-amino-2-trifluoromethylphenoxy)biphenyl. NMR spectra confirmed the identity of the product.

EXAMPLE 1

Into a 100 ml resin kettle was weighed 6.315 g FAPB, 3.682 g 3,3',4,4'-tetracarboxybiphenyl dianhydride (BPDA), and 56.7 g of NMP. The inherent viscosity of this solution was measured to be 1.59 dl/g. Films were cast from the polymer solution and cured by heating to 300° C. Physical properties of the FAPB-BPDA polymer are presented in Table I below.

EXAMPLE 2

Using 1.210 g pyromellitic dianhydride (PMDA) and 2.798 g FAPB, Example 2 was prepared in a manner similar to Example 1, above.

EXAMPLE 3

Using 4.001 g 2,2-bis(3,4-dicarboxyphenyl)propane dianhydride (IPAN) and 6.003 g FAPB, Example 3 was prepared in a manner similar to Example 1, above.

EXAMPLE 4

Using 1.875 g 2,2-bis(3,4-dicarboxyphenyl)hexafluoropropane dianhydride (6FDA) and 2.131 g FAPB, Example 4 was prepared in a manner similar to Example 1, above.

EXAMPLE 5

Using bis-(3,4-dicarboxyphenyl)ether dianhydride (OPAN) and 6.191 g FAPB, Example 5 was prepared in a manner similar to Example 1, above.

The physical properties of Examples 1-5 are presented in Table I, below.

TABLE I

| Example Number | Tg (°C.) | TGA (°C.) (N₂) | TGA (°C.) (Air) | E* | % Moisture Uptake** |
|---|---|---|---|---|---|
| 1 | 274 | 518 | 512 | 3.04 | 0.3 |
| 2 | 310 | 437 | 460 | 3.04 | 0.3 |
| 3 | 264 | 506 | 468 | 2.98 | 0.2 |
| 4 | 271 | 497 | 496 | 2.85 | 0.2 |
| 5 | 244 | 483 | 528 | 3.06 | 0.2 |

*E is the dielectric constant measured at 1 MHz.
**Weight percent moisture uptake.

Comparative Runs A-E

Using the appropriate amount of dianhydride, diamine, and NMP, Comparative Runs A-E were prepared in a manner similar to Example 1 above. However, to provide a comparison to Examples 1-5, these polymers were prepared using the aromatic diamine 4,4'-bis(4-aminophenoxy)biphenyl (APBP), which is analogous to the diamine FAPB described in this disclosure but does not contain trifluoromethyl moieties positioned meta to the amine moieties.

The stoichiometric weights and physical properties of Comparative Runs A-E are presented in Table II below.

TABLE II

| Comparative Number | Dianhydride (g) | | APBP (g) | Tg (°C.) | TGA (°C.) (N₂) | TGA (°C.) (Air) |
|---|---|---|---|---|---|---|
| A | BPDA | 19.974 | 25.024 | >400 | 557 | 523 |
| B | PMDA | 13.303 | 22.615 | >400 | 549 | 520 |
| C | IPAN | 3.578 | 3.920 | 273 | 512 | 464 |
| D | 6FDA | 20.515 | 17.012 | 282 | 485 | 459 |
| E | OPAN | 4.796 | 5.700 | 250 | 501 | 501 |

| Example Number | E* | % Moisture Uptake** |
|---|---|---|
| A | 3.09 | 0.5 |
| B | 3.08 | 0.5 |
| C | 3.04 | 1.0 |
| D | 2.86 | 0.7 |
| E | 3.12 | 0.7 |

*E is the dielectric constant measured at 1 MHz.
**Weight percent moisture uptake.

It can be seen, then, that the FAPB polymers of the present invention, illustrated in Table I, display lower dielectric constants and lower percent moisture uptake values than the dielectric constants and percent moisture uptake values found in the APBP polymers, illustrated by the Comparative Runs A-E in Table II. Further, the FAPB polymers of the present invention maintain good thermal degradation temperatures while providing lower glass transition temperatures that are found in the Comparative Runs A-E. The polymers of the present invention, therefore, will provide good planarization on nonplanar substrates used in multilayer electronic applications.

This invention has been described in terms of specific embodiments set forth in detail. It should be understood, however, that these embodiments are presented by way of illustration only and that the invention is not necessarily limited thereto. Modifications and variations within the spirit and scope of the claims that follow will be readily apparent from this disclosure, as those skilled in the art will appreciate.

What is claimed is:

1. A polyimide composition comprising recurring units of

5. A polymer composition comprising recurring units of

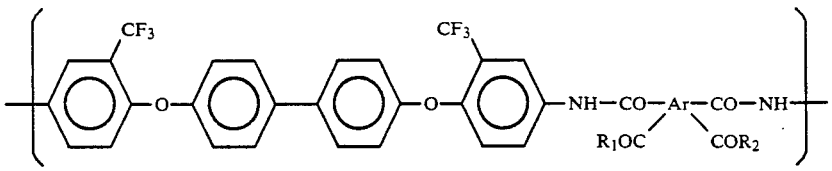

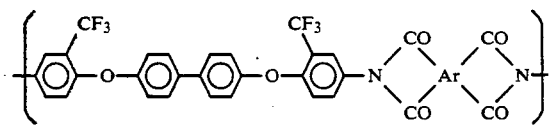

wherein Ar is selected from the group consisting of

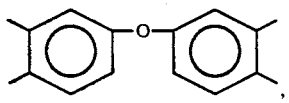

and

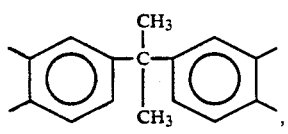

2. A polyimide solution containing the polymer of claim 1.

3. A structure comprising at least one substrate coated with at least one layer of the polyimide composition of claim 1.

4. The structure of claim 3 having two or more layers of the polyimide of claim 1.

wherein $R^1$ and $R^2$ are independently selected from halogen, —OH, and —$OR^3$ where $R^3$ is an alkyl group 1 to 4 carbon atoms; and wherein Ar is selected from the group consisting of

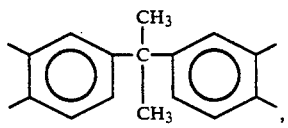

and

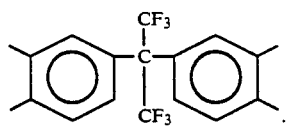

6. A structure comprising at least one substrate coated with at least one layer of the polyimide composition of claim 5.

7. The structure of claim 6 having two or more layers of the polyimide of claim 5.

8. The polymer composition of claim 5 wherein $R^1$ and $R^2$ are each chlorine.

9. A polyimide solution containing the polymer of claim 5.

* * * * *